(12) United States Patent
Chuang

(10) Patent No.: US 7,783,796 B2
(45) Date of Patent: Aug. 24, 2010

(54) METHOD FOR RELEASING DATA OF STORAGE APPARATUS

(75) Inventor: Yueh-Lin Chuang, Kaohsiung (TW)

(73) Assignee: Industrial Technology Research Insitute, Hsinchu (TW)

( * ) Notice: Subject to any disclaimer, the term of this patent is extended or adjusted under 35 U.S.C. 154(b) by 326 days.

(21) Appl. No.: 11/302,739

(22) Filed: Dec. 13, 2005

(65) Prior Publication Data

US 2007/0094457 A1 Apr. 26, 2007

(30) Foreign Application Priority Data

Oct. 21, 2005 (TW) .............................. 94136826 A

(51) Int. Cl.
G06F 3/00 (2006.01)
G06F 5/00 (2006.01)
G06F 13/00 (2006.01)
H04L 12/50 (2006.01)
G06F 9/34 (2006.01)

(52) U.S. Cl. ........................... 710/52; 710/62; 370/390; 370/389; 370/381; 711/154; 711/202; 711/203

(58) Field of Classification Search ................... 710/62, 710/52; 370/390, 389, 381; 711/154, 202, 711/203

See application file for complete search history.

(56) References Cited

U.S. PATENT DOCUMENTS

| 4,318,175 | A   | * | 3/1982  | Hawley       | 711/5    |
| 6,192,028 | B1  | * | 2/2001  | Simmons et al. | 370/229  |
| 6,836,480 | B2  |   | 12/2004 | Basso et al. | 370/390  |
| 2003/0099242 | A1 | * | 5/2003 | Shah et al.  | 370/395.4 |
| 2004/0095934 | A1 |   | 5/2004 | Cheng et al. | 370/390  |
| 2004/0218592 | A1 |   | 11/2004 | Ngar et al. | 370/381  |

* cited by examiner

Primary Examiner—Henry W. H. Tsai
Assistant Examiner—Tushar S Shah
(74) Attorney, Agent, or Firm—J.C. Patents

(57) ABSTRACT

The present invention provides a method for releasing data of a storage apparatus. The method manages the data output of the storage apparatus by using a virtual output queue, a data storing memory, and a bit map output port memory. In such method, the output ports, which use the data stored in any data column of the data storing memory, are recorded in the bit map output port memory. In addition, the addresses of the data storing memory for storing the data output from any output port are provided by the virtual output queue. After all data of a certain data column is completed read out, the data storing column in the data storing memory and a corresponding part of the bit map output port memory are released by the storage apparatus.

10 Claims, 3 Drawing Sheets

[//]: # (Page 1)

METHOD FOR RELEASING DATA OF STORAGE APPARATUS

CROSS-REFERENCE TO RELATED APPLICATION

This application claims the priority benefit of Taiwan application serial no. 94136826, filed on Oct. 21, 2005. All disclosure of the Taiwan application is incorporated herein by reference.

BACKGROUND OF THE INVENTION

1. Field of the Invention

The present invention relates to a memory operating method, and more particularly, to a method for releasing data of a storage apparatus.

2. Description of the Related Art

Along with the highly development of the Internet, the network congestion problem is becoming worse now, which significantly impacts the network service quality. In order to eliminate such data transmission bottleneck, many designers in the related arts are dedicated in studying and developing the technique of how to speed up the data transmission rate and improve the data processing speed on the network. A couple of studies, such as U.S. Publication No. 20040218592 of "Method and apparatus for fast contention-free, buffer management in a multi-lane communication system", U.S. Publication No. 20040095934 of "System and method for hardware accelerated packet multicast in a virtual routing system", and U.S. Pat. No. 6,836,480 of "Data structures for efficient processing of multicast transmissions", are the pioneers in this field.

However, the memory management methods used in the studies mentioned above are quite complicate. For example, as described in U.S. Publication No. 20040218592, the memory operation function is performed by using a structure pointer, a packet pointer, a structure pointer memory, a head&tail memory, and a multiplicity memory in cooperating with the complicate logic operations. In other words, the conventional memory management method is quite complicate, although it can speed up the data processing, it also brings a great workload to the processor, which relatively reduces the applicability of these techniques.

SUMMARY OF THE INVENTION

Therefore, it is an object of the present invention to provide a method for releasing data of a storage apparatus, such as the dynamic random access memory (DRAM), which effectively speeds up the data exchange and improves the system performance with simple operations.

The present invention provides a method for releasing data of the storage apparatus. The method comprises the following steps. First, a virtual output queue memory having a plurality of virtual output queues, a data storing memory having a plurality of data columns, and a bit map output port memory having a plurality of bit map columns are provided. Wherein, each of the virtual output queues corresponds to each respective output port. In addition, the data to be output from a certain to-be-processed output port among the output ports is stored in a to-be-processed data column of the data columns mentioned above. Moreover, each bit map column has a plurality of bits, and the to-be-processed data column in the data storing memory mentioned above corresponds to a certain to-be-processed bit map column in the bit map columns.

Then, each bit in the to-be-processed bit map column is corresponding to a certain output port, so as to indicate that the data to be output from the specific output port had been stored in the to-be-processed data column. In addition, the addresses of the data output from the to-be-processed output port in the to-be-processed data column are stored in a virtual output queue block. Then, the virtual output queue block is written into the virtual output queue corresponding to the to-be-processed output port at an appropriate time. Thereafter, the to-be-processed output port obtains the data from the to-be-processed data column according to the addresses read from the virtual output queue block (i.e. the addresses of the data storing memory where the data is stored). In addition, after the data is obtained by the to-be-processed output port, the state of the bit in the to-be-processed bit map column corresponding to the to-be-processed output port is changed. Finally, when the bit in the to-be-processed bit map column indicates that all data of a certain to-be-processed data column stored in the output port is completely processed, the space of the to-be-processed data column is released at one time. And the value of each bit in the corresponding to-be-processed bit map column is reset.

In an embodiment of the present invention, in order to have the bit in the to-be-processed bit map column corresponding to the output port one by one to indicate that the data to be output from the specific output port had been stored in the to-be-processed data column, the bits respectively corresponding to the output ports where the data is obtained from the to-be-processed data column are set as a first predetermined value, and the bits corresponding to other output ports are set as a second predetermined value. Wherein, the first predetermined value is 1, and the second predetermined value is 0. Alternatively, the first predetermined value is 0, and the second predetermined value is 1.

In the present embodiment, after the to-be-processed output port obtains the data, the bit value of the to-be-processed bit map column corresponding to the to-be-processed output port is changed from the first predetermined value to the second predetermined value, such that the state of the bit of the to-be-processed bit map column corresponding to the to-be-processed output port is changed.

In an embodiment of the present invention, when a record of data is to be output from multiple output ports, this record of data is copied to multiple copies, and such multiple copies are stored in the data storing memory. Alternatively, an address of the data storing memory where the data is stored is copied to multiple copies that are subsequently stored in the virtual output queue block of different output ports, and this single copy of data is stored in the data storing memory.

In an embodiment of the present invention, the step of writing the virtual output queue block into the virtual output queue corresponding to the to-be-processed output port comprises: determining whether or not the virtual output queue block is filled up with the addresses of the data to be output from the to-be-processed output port in the to-be-processed data column; and writing the virtual output queue block into the virtual output queue corresponding to the to-be-processed output port when the virtual output queue block is filled up with the addresses.

In an embodiment of the present invention, the step of writing the virtual output queue block into the virtual output queue corresponding to the to-be-processed output port comprises: determining whether or not the existing of the virtual output queue block reaches a predetermined send-out time period; and writing the virtual output queue block into the virtual output queue corresponding to the to-be-processed output port when the existing of the virtual output queue block reaches the predetermined send-out time period.

In summary, the hardware structure used in the method for releasing data of the storage apparatus provided by the present invention is quite simple, and the logic operations between each hardware component is simplified when compared with the conventional technique. Accordingly, the technique provided by the present invention is the optimal choice for the current network environment.

BRIEF DESCRIPTION DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION PREFERRED EMBODIMENTS

Figure 1:
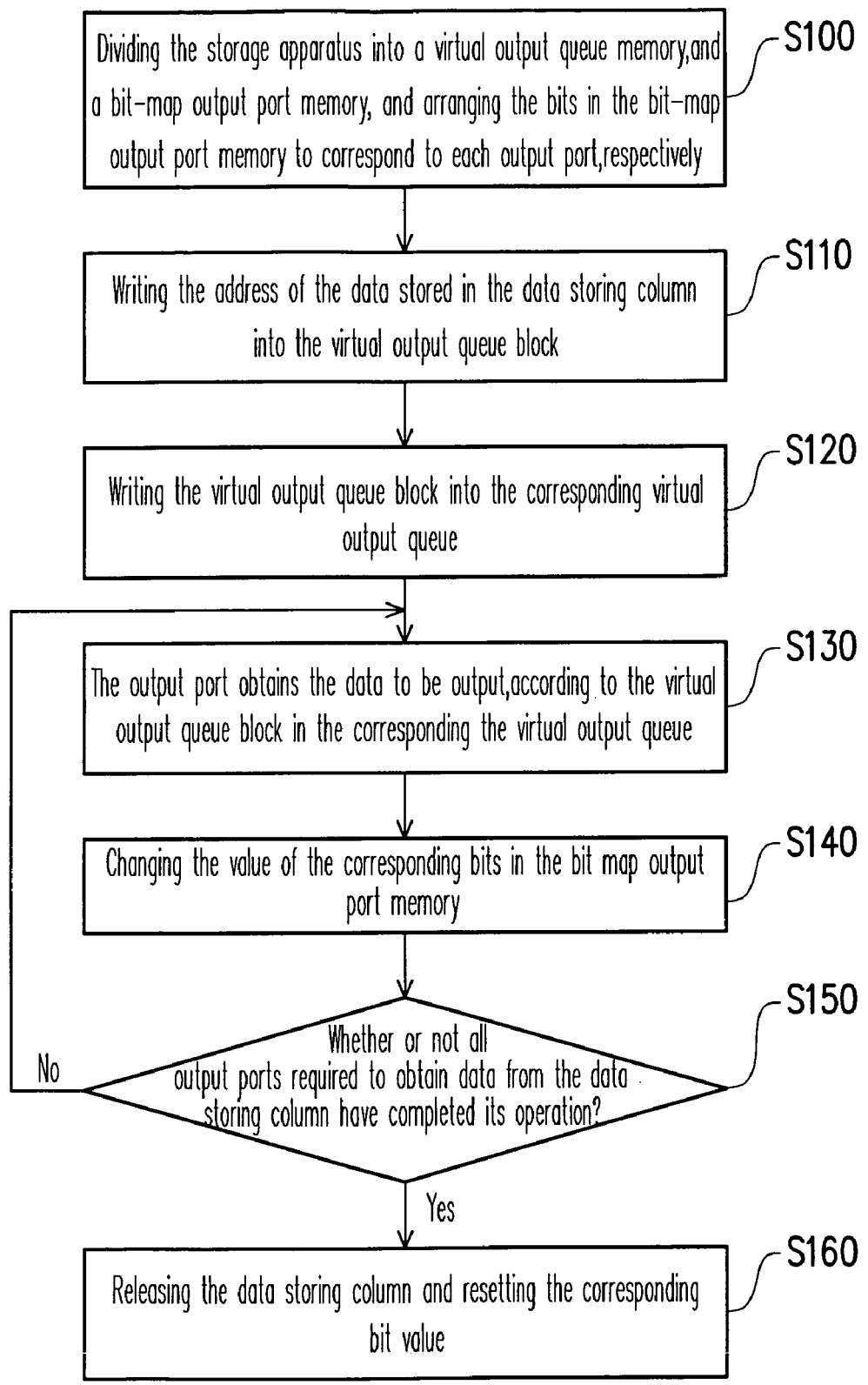
FIG. 1 is a flow chart illustrating a method for releasing data of the storage apparatus according to an embodiment of the present invention.

In order to have clear descriptions, the dynamic random access memory (DRAM) is taken as one embodiment of the storage apparatus. FIG. 1 is a flow chart illustrating a method for releasing data of the storage apparatus according to an embodiment of the present invention. In the present embodiment, by logically dividing the same storage apparatus or using different memory, a virtual output queue (VOQ), a data storing memory, and a bit map output port memory are provided (step S100).

Figure 2:
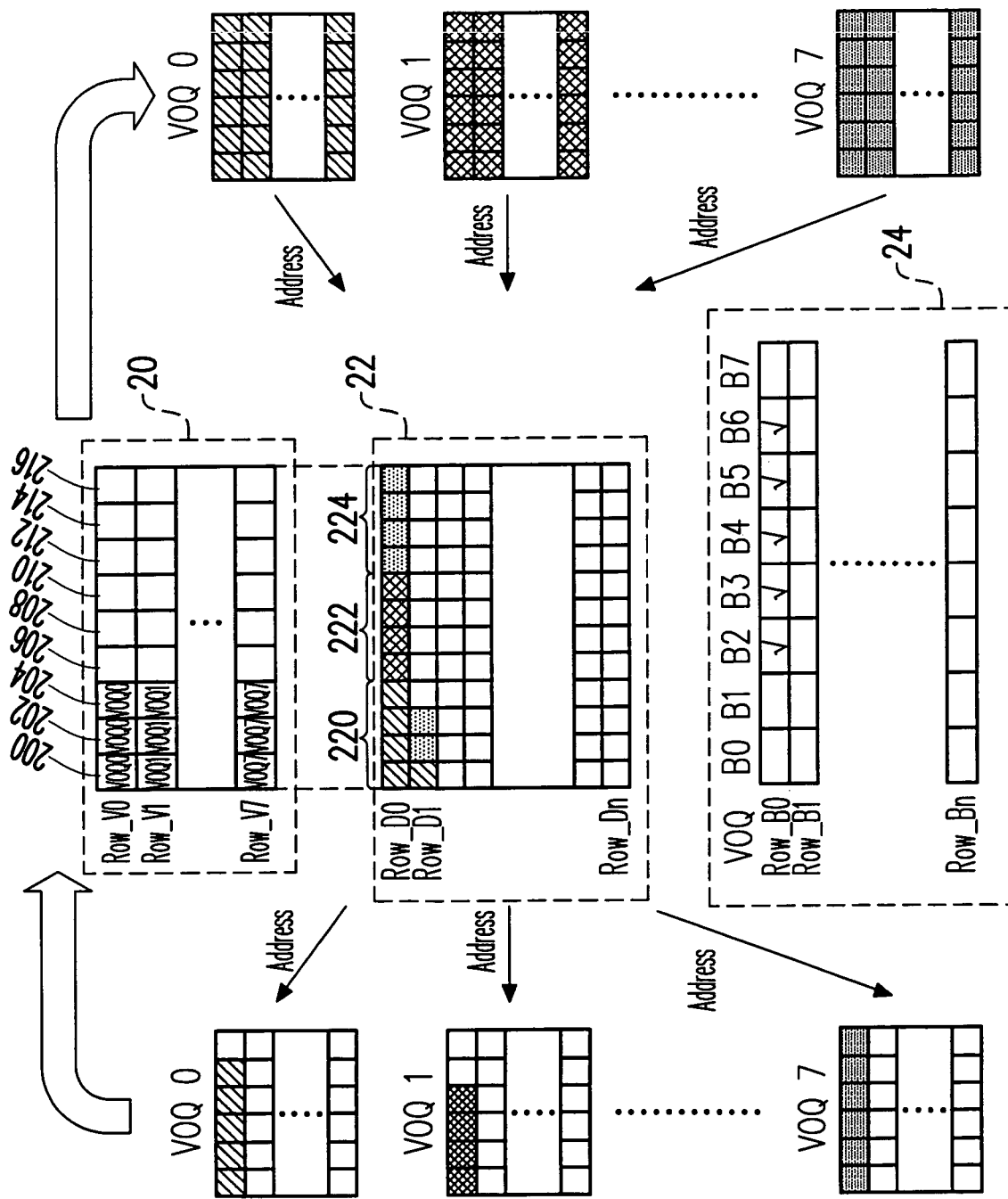
FIG. 2 is a schematic configuration diagram of a method for releasing data of the storage apparatus according to an embodiment of the present invention.

For example, referring to FIG. 2, FIG. 2 is a schematic configuration diagram of a method for releasing data of the storage apparatus according to an embodiment of the present invention. The configuration shown in FIG. 2 comprises a VOQ memory 20, a data storing memory 22, and a bit map memory 24. In addition, 8 output ports (not shown) are exemplified in the diagram for description, thus the VOQ memory 20 comprises 8 virtual output queues Row_V0-Row_V7 that respectively correspond to the 8 output ports, and each of the bit map columns Row_B0-Row_Bn of the bit map output port memory 24 comprises 8 bits B0-B7 that respectively correspond to the 8 output ports. In addition, when storing the data, the data is stored in the data storing memory 22 according to a specific order of the data storing columns, and the storing size mask is a packet size. In other words, when the remaining space of a certain data storing column is less than a packet size, the packet is sent to the next data storing column for storing, and the remaining space of the original data storing column is used to store the redundant data. Accordingly, the integrity of the packet can be preserved, and the problem of two contiguous data storing columns each having a part of the same packet is eliminated.

Referring to FIG. 1 again, after the basic hardware configuration is configured and starts to operate, the data is written to the data storing memory 22. Meanwhile, the addresses of the packet written into each respective data storing memory is written into a corresponding virtual output queue block according to which the output port the packet will be transmitted to (step S110).

Referring to FIG. 2, when the data storing column Row_D0 (or called the to-be-processed data storing column) is filled up with the data and ready to step into the next data storing column Row_D1 for storing the subsequent data, it has to check and confirm that the data storing column Row_D0 does store the data to be output from the specific output ports. In the present embodiment, the storing cell set 220 in the data storing column Row_D0 stores the data to be output from the output port 0, the storing cell set 222 stores the data to be output from the output port 1, and the storing cell set 224 stores the data to be output from the output port 7. Besides this, the data to be output from other output ports is not stored in the data storing column Row_D0. Therefore, the addresses covered by the storing cell set 220 are written into the virtual output queue block VOQ0, the addresses covered by the storing cell set 222 are written into the virtual output queue block VOQ1, and the addresses covered by the storing cell set 224 are written into the virtual output queue block VOQ7. In addition, the bit map column Row_B0 of the bit map memory 24 (meanwhile it is corresponded to the to-be-processed bit map column of the to-be-processed data storing column) marks the corresponding bits B2-B6 (e.g. the bit value is set to a specific predetermined value, such as a logic value 1) for the output ports 2-6 to indicate that the data storing column Row_D0 does not store the data required by these output ports. Since the output ports 0, 1, and 7 needs to obtain data from the data storing column Row_D0, the values of the corresponding bits B0, B1, and B7 are set to another predetermined value (e.g. the logic value 0).

Referring to FIG. 1 and FIG. 2, after the addresses starts to be written into the virtual output queue block, under a specific condition, the virtual output queue blocks VOQ0-7 mentioned above are formally written into the VOQ memory 20 (step S120). Here, this condition may be either that the virtual output queue block is filled up with the addresses, or that the existing time of the virtual output queue block exceeds a predetermined send-out time period counting from the first address being stored. As shown in FIG. 2, the virtual output queue blocks VOQ0-7 corresponding to each output port are sent to the corresponding virtual output queues Row_V0-Row_V7 according to its respective output port. And, each of the virtual output queue blocks occupies a block in a virtual output queue, such as the blocks 200-216.

When the virtual output queue block containing the data addresses is contained in the virtual output queue, the corresponding output port can obtain the data from the data storing memory 22 according to these data addresses (step S130). Each time when an output port (i.e. the to-be-processed output port) had completely obtained all data in the same data storing column, in the bit map memory 24, the value of the bit corresponding to the to-be-processed output port in the corresponding data storing column (i.e. the to-be-processed data storing column) should be correctly set again (step S140).

For example, the output port 0 (meanwhile it is the to-be-processed output port) obtains the data from the storing cell set 220 in the data storing column Row_D0 (meanwhile it is the to-be-processed data storing column) according to the addresses contained in the virtual output queue block VOQ0. Thus, since the output port 0 has completely obtained all data required by the data storing column Row_D0, the bit B0 in the bit map column Row_B0 (meanwhile it is the to-be-processed bit map column) should be correctly set.

Figure 3:
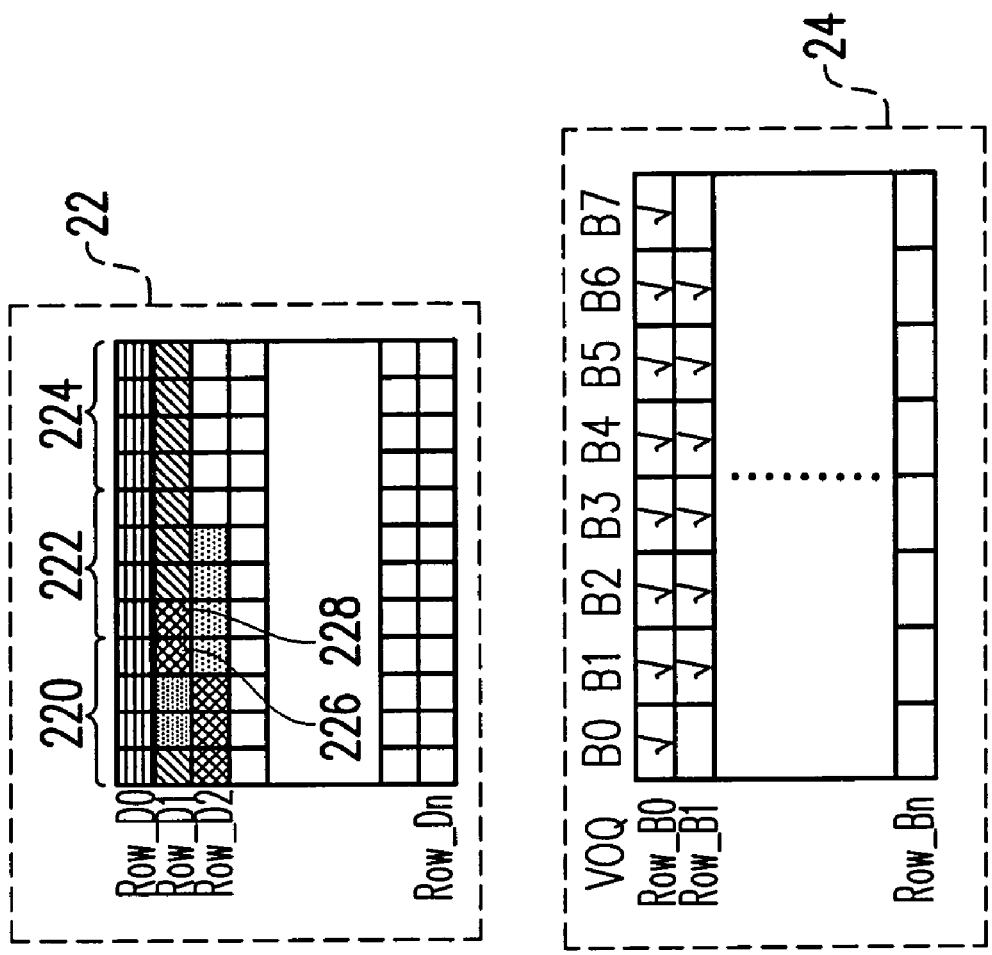
FIG. 3 is a schematic configuration diagram of a method for releasing data of the storage apparatus according to an embodiment of the present invention.

FIG. 3 is a schematic configuration diagram of a method for releasing data of the storage apparatus according to an embodiment of the present invention. The timing points shown in FIG. 3 illustrate a case where all of the output ports in the data storing column Row_D0 requiring to obtain the data, such as the output ports 0, 1, and 7, had all obtained the desired data. Meanwhile, since all of the output ports had obtained the desired data, all of the bits B0, B1, and B7 in the bit map column Row_B0 are set as a certain predetermined value (e.g. the logic value 1). In addition, while transmitting the data via the output port, other packets are continuously stored into the data storing memory 22, thus the data is stored in the data storing column Row_D2. Especially, when the data is storing into the data storing column Row_D1, one packet should be output from the output ports 0 and 7 simultaneously, that is the so called multicast packet. In the present embodiment, the multicast packet is copied into multiple copies of the same data (where the quantity of the copies is the same as the quantity of the output ports being used), and the data is sequentially stored in the data storing memory 22. In the present embodiment, such type of data is stored in the storing cells 226 and 228.

However, other methods can also be used to deal with the multicast packet. For example, when storing the data, it is also possible to store only one copy of the multicast packet rather than copying it into multiple copies. However, in such case, the address of the multicast packet data should be sent to all output ports from which the multicast packet should be output. In other words, the address of the data in the data storing memory can be copied into multiple copies that are then stored in the virtual output queue block of each different output port, and the single copy of the data is stored in the data storing memory. With such method, the space occupied by the multicast packet in the data storing memory 22 is effectively decreased.

Furthermore, as shown in FIG. 3, when a bit in the bit map column indicates that all data in the corresponding data storing column had been read out (step S150), the bit map column should be reset, and the space occupied by the corresponding data storing column is released (step S1160). In the present embodiment, since all bits in the bit map column Row_B0 are set as the same value, the bit map column Row_B0 can be reset, and the space occupied by the data storing column Row_D0 corresponding to the bit map column is released for storing other data.

It is to be noted that although the data storing memory 22 and the bit map memory 24 in the previous embodiment have the same n+1 columns, the bit map memory 24 may have a different number of columns in the physical case. In other words, as long as it can provide the appropriate logic, the number of columns in the bit map memory 24 can be less than the one in the data storing memory 22.

In summary, the technique provided by the present invention effectively reduces the complexity of the packet related information linkage. Accordingly, comparing to the conventional technique, the present invention is easier and faster in processing packet data and more suitable for applying in the high speed network environment.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. A method for releasing data of a storage apparatus, comprising:
   providing an external memory device, configured to have a virtual output queue memory, a data storing memory, a bit map output port memory, wherein the external memory device communicates with a network processor, wherein the virtual output queue memory has a plurality of virtual output queues, the data storing memory has a plurality of data columns, and the bit map output port memory has a plurality of bit map columns, wherein the virtual output queues correspond to a plurality of output ports respectively, such that the data to be output from a to-be-processed output port in the output ports is stored in a to-be-processed data column in the data columns, and the to-be-processed data column corresponds to a to-be-processed bit map column in the bit map columns;
   arranging a plurality of bits for each of the bit map columns, wherein the bits in the to-be-processed bit map column are corresponding to the output ports respectively to indicate that the data to be output from the specific output ports is stored in the to-be-processed data storing column, wherein a first bit state of the bits indicates the data is not yet read at the corresponding to-be-processed output port and a second bit state of the bits indicates no data is to be read or the data has already been read at the to-be-processed corresponding output port;
   storing the addresses of the data required to be output from the to-be-processed output port in the to-be-processed data column into a virtual output queue block;
   writing the virtual output queue block into the virtual output queue corresponding to the to-be-processed output port;
   setting the corresponding bit to the to-be-processed output port as the first bit state;
   having the to-be-processed output port to obtain the data from the to-be-processed data column according to the virtual output queue block;
   changing the first bit state of the bit into the second bit state corresponding to the to-be-processed output port in the to-be-processed bit map column after the to-be-processed output port reads the data; and
   when the bits in the to-be-processed bit map column are all at the second bit state for indicating that the output ports have completely processed the data stored in the to-be-processed data column, releasing a space occupied by the to-be-processed data column herein all the bits in the to-be-processed bit map column remains at the second bit state until next time in use.

2. The method for releasing data of the storage apparatus of claim 1, wherein the step of arranging the plurality of bits in the to-be-processed bit map column for corresponding to the output ports respectively to indicate that the data to be output from the specific output ports is stored in the to-be-processed data storing column comprises:
   setting a part of the bits corresponding to a part of the output ports that requires obtaining the data from the to-be-processed data column as a first predetermined value; and
   setting another part of the bits corresponding to another part of the output ports as a second predetermined value.

3. The method for releasing data of the storage apparatus of claim 2, wherein the first predetermined value is a logic value 1, and the second predetermined value is a logic value 0.

4. The method for releasing data of the storage apparatus of claim 2, wherein the first predetermined value is a logic value 0, and the second predetermined value is a logic value 1.

5. The method for releasing data of the storage apparatus of claim 2, wherein the step of changing the state of the bit corresponding to the to-be-processed output port in the to-be-processed bit map column after the to-be-processed output port obtaining the data comprises:

changing the bits corresponding to the to-be-processed output ports in the to-be-processed bit map column from the first predetermined value to the second predetermined value after the to-be-processed output port obtaining the data.

6. The method for releasing data of the storage apparatus of claim 1, wherein when one copy of data is required to be output from multiple of the output ports, the data is copied into multiple copies of the same data, and the multiple copies of the same data are stored in the data storing memory.

7. The method for releasing data of the storage apparatus of claim 1, wherein when one copy of data is required to be output from multiple of the output ports, the address of the data is copied into multiple copies, and the multiple copies of the address for the same data are stored in the virtual output queue block.

8. The method for releasing data of the storage apparatus of claim 1, wherein the step of writing the virtual output queue block into the virtual output queue corresponding to the to-be-processed output port comprises:
   determining whether the virtual output queue block is filled up with the addresses of the data required to be output from the to-be-processed output ports in the to-be-processed data column; and
   writing the virtual output queue block into the virtual output queue corresponding to the to-be-processed output port when the virtual output queue block is filled up with the addresses.

9. The method for releasing data of the storage apparatus of claim 1, wherein the step of writing the virtual output queue block into the virtual output queue corresponding to the to-be-processed output port comprises:
   determining whether or not the virtual output queue block is existing for a time period reaching a predetermined send-out time period; and
   writing the virtual output queue block into the virtual output queue corresponding to the to-be-processed output port when the virtual output queue block is existing for the time period reaching the predetermined send-out time period.

10. The method for releasing data of the storage apparatus of claim 1, wherein the external memory device includes an external dynamic random access memory.

* * * * *